Dec. 20, 1966 J. M. GAULT 3,293,511

FIELD EFFECT TRANSISTOR WITH CONCENTRIC INTERIOR ELECTRODE

Filed Aug. 21, 1963

INVENTOR.
JOHN M. GAULT

BY

OSTROLENK, FABER, GERB & SOFFEN
ATTORNEYS

United States Patent Office 3,293,511

Patented Dec. 20, 1966

3,293,511

FIELD EFFECT TRANSISTOR WITH CONCENTRIC INTERIOR ELECTRODE

John M. Gault, Manhattan Beach, Calif., assignor to International Rectifier Corporation, El Segundo, Calif., a corporation of California Filed Aug. 21, 1963, Ser. No. 303,592

3 Claims. (Cl. 317—235)

This invention relates to field effect transistors, and more specifically relates to a field effect transistor having an improved linearity between signal voltage and output current.

Field effect transistors are well known to the art, and control the flow of current through a semiconductor body by controlling the effective width of a space charge in the area through which the current must flow to thereby effectively control the effective cross-sectional area available for current flow.

In presently available field effect transistors, there is substantial non-linearity between the output of the transistor and the input to the transistor grid or base. This non-linearity is occasioned because the effective width of the space charge is proportional to the square root of the control voltage.

The principle of the present invention is to rearrange the geometry of a field effect transistor in such a manner that the width of the space charge is approximately proportional to the control voltage whereby the output current is rendered more linear with respect to the input current. Thus, the novel field effect transistor of the invention may now be used in many amplification applications which require greater linearity than provided by presently available devices.

Accordingly, a primary object of this invention is to provide a novel field effect transistor having improved linearity.

Another object of this invention is to provide a novel field effect transistor which can be used in amplifiers requiring a predetermined degree of linearity.

Another object of this invention is to provide a novel field effect transistor in which the growth of the space charge area is approximately proportional to the control voltage.

These and other objects of this invention will become apparent from the following description when taken in connection with the drawings, in which.

Figure 1:
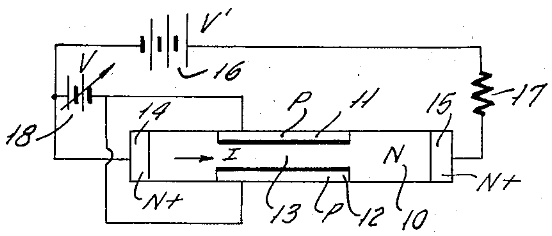
FIGURE 1 illustrates a typical prior art type field effect transistor.

Referring first to FIGURE 1, the field effect transistor shown therein is constructed in accordance with typical prior art techniques, and is comprised of a body 10 of N type semiconductor material which contains therein two opposing P type sections 11 and 12 which define a current "pinching" region 13, through which output current I may flow. The ends of the N type body 10 are then provided with two N+ regions 14 and 15 which receive suitable electrodes for connection to external circuitry.

The typical control circuitry will include a source of bias voltage 16 which has a voltage V', and is connected in series with regions 14, 13, 15 and an output load 17 which may be of any suitable nature.

A source of control voltage 18 is then connected from region 14 to each of the P type regions 11 and 12 which are provided with suitable terminals for this connection. The voltage source 18 has a variable voltage V which can represent any suitable input signal voltage for the device.

In operation of the device of FIGURE 1, as the control voltage 18 is increased, the effective space charge region surrounding the junctions formed by P regions 11 and 12 will gradually spread and approach one another, thus effecting a pinching action on the current I. Saturation current is reached when the space charge regions of region 13 join one another to cause a saturation effect.

Figure 2:
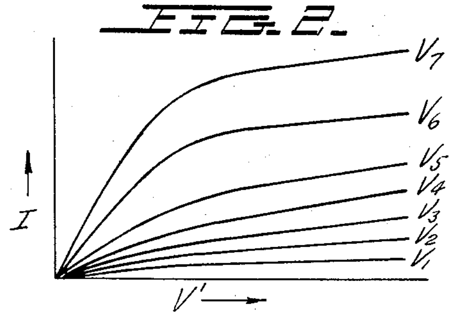
FIGURE 2 illustrates a family of curves showing the output current as a function of bias voltage for different values of control voltage.

Such devices have characteristic curves of the type shown in FIGURE 2 wherein it is seen that the output current I with a constant bias voltage V' varies nonlinearly with the control voltage V.

Figure 3:
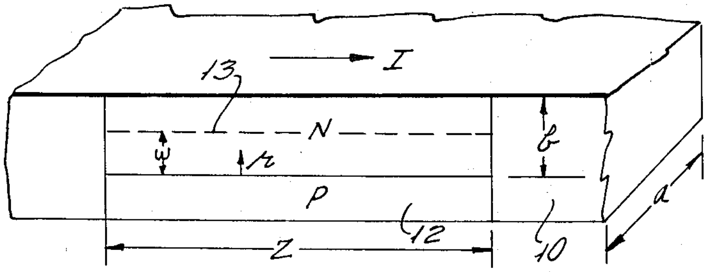
FIGURE 3 illustrates one of the junctions of the device of FIGURE 1 partially in perspective view to illustrate how a change in output current is proportional to a change in the control voltage.

The reason for this variation will be understood from a consideration of FIGURE 3 which illustrates a portion of the device of FIGURE 1 wherein the length of region 13 is Z, the height of region 13 is *b*, the width of region 13 is *a*, the effective width of the space charge is *w*, and the resistivity of the N type region is P.

It can be shown from FIGURE 3 that a change in current Δ1 is related to a change in control voltage ΔV by the following relation:

$$\Delta V=\frac{eN_bP1}{\epsilon\epsilon_0V'a}w\Delta I$$

In the above noted equation, *e* is the charge on an electron, while $N_b$ is a doping impurity concentration.

The foregoing equation illustrates the essential nonlinear characteristic of the field effect transistor of FIGURE 1 where 1 is proportional to $1\sqrt{V'}$, which is due to the specific geometry of the device.

In accordance with the invention, the reduction in effective conduction cross-sectional area is made proportional to the square of the space charge width whereby the output current I will be rendered a linear function of input.

Figure 4:
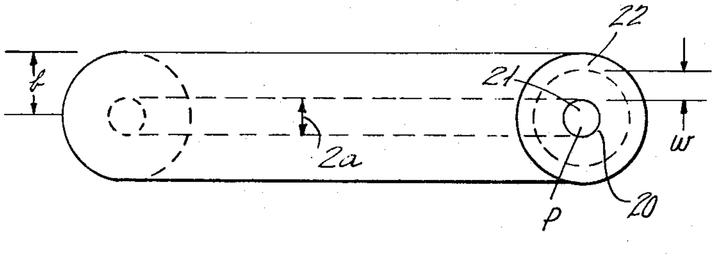
FIGURE 4 illustrates an idealized arrangement for a junction in which output current is proportional to control voltage.

A geometric figure where this relation would exist is a cylinder of circular cross-section having a junction at the center thereof, as illustrated in FIGURE 4. Thus, in FIGURE 4, a cylinder is formed having a junction 20 interposed between a P type region 21 and an N type region 22. The P type region has a diameter of 2*a*, while the complete device has a diameter of 2*b*. The thickness *b*–*a*–*w* of the conduction cross-sectional area is indicated by the dotted line in FIGURE 4.

The geometrical figure of FIGURE 4 can be shown to provide the following relationship between control voltage and current:

$$\Delta V=\frac{-eN_bPz}{2V'\pi\epsilon\epsilon_0}\ln\frac{a+w}{a}\Delta I$$

Figure 5:
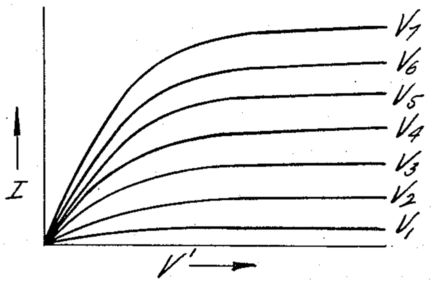
FIGURE 5 illustrates the characteristic curves similar to FIGURE 2 that would result from the improved linearity device of FIGURE 4.

From the foregoing relation, a junction arrangement such as that shown in FIGURE 4 will provide a far more linear device than that of FIGURE 1 and would have characteristic curves of the type shown, for example, in FIGURE 5.

Figure 6:
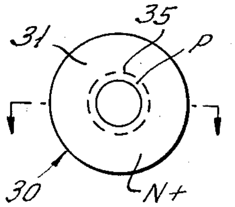
FIGURE 6 is a front view of a novel field effect transistor constructed in accordance with the present invention.
Figure 7:
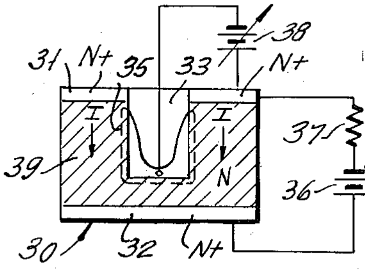
FIGURE 7 is a cross-sectional view of FIGURE 6 taken across the lines 7—7 in FIGURE 6.

The manner in which such a device can be formed is illustrated in FIGURES 6 and 7. Referring now to FIGURES 6 and 7, I have illustrated therein a cylindrical body 30 which has a body portion 39 of N type material whcih has the ends thereof formed with N+ regions 31 and 32 to receive appropriate electrical terminals. An opening 33 is then formed in the cylinder, and a P type region 35 is formed in this opening.

A source of bias voltage V′ 36 is then connected in series with regions 31, 32 and an appropriate load means 37, while the source of control voltage 38 is connected between regions 31 and 35.

A source of bias voltage V′ 36 is then connected in series with regions 31, 32 and an appropriate load means 37, while the source of control voltage 38 is connected between regions 31 and 35.

The manner in which the novel field effect transistor of FIGURES 6 and 7 may be fabricated is well within techniques available to the art, and could be formed in any of the available desired manners.

The operation of the device will create a far more linear relationship between the output current I and the control voltage V for a constant bias voltage V′. Thus, the device will have wide application in amplifier-type uses.

Although this invention has been described with respect to preferred embodiments thereof, it should be understood that many variations and modifications will now be obvious to those skilled in the art, and it is preferred, therefore, that the scope of this invention be limited not by the specific disclosure herein, but only by the appended claims.

The embodiments of the invention in which an exclusive privilege or property is claimed are defined as follows:

1. A field effect transistor comprising a wafer of semiconductor material of one of the conductivity types having a centrally located opening therein extending from one surface of said wafer to a given depth; at least a portion of the walls of said opening being of the other of the conductivity types; and first and second electrode means on the upper and lower surfaces of said wafer and a third electrode means connected to the interior wall of said opening.

2. The device substantially as set forth in claim 1 wherein said walls of said opening are of the P type conductivity and the concentrically arranged area surrounding said walls is of the N type conductivity.

3. The device of claim 1 wherein said wafer is cylindrical.

References Cited by the Examiner

UNITED STATES PATENTS

| | | | |
|---|---|---|---|
| 2,987,659 | 6/1961 | Teszner | 317—235 |
| 3,007,119 | 10/1961 | Barditch | 332—31 |
| 3,025,438 | 3/1962 | Wegner | 317—235 |
| 3,152,294 | 10/1964 | Siebertz | 317—235 |
| 3,201,665 | 8/1965 | Venables | 317—235 |

JOHN W. HUCKERT, *Primary Examiner.*

M. EDLOW, *Assistant Examiner.*